(12) United States Patent
Shim (10) Patent No.: US 8,545,721 B2
(45) Date of Patent: *Oct. 1, 2013

(54) UV COATING COMPOSITION FOR LED COLOR CONVERSION

(75) Inventor: Hyun-Seop Shim, Seoul (KR)

(73) Assignee: Hyun-Seop Shim, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/581,001

(22) PCT Filed: Aug. 12, 2010

(86) PCT No.: PCT/KR2010/005285
§ 371 (c)(1),
(2), (4) Date: Aug. 24, 2012

(87) PCT Pub. No.: WO2011/105666
PCT Pub. Date: Sep. 1, 2011

(65) Prior Publication Data
US 2012/0313045 A1    Dec. 13, 2012

(30) Foreign Application Priority Data

Feb. 24, 2010  (KR) .................. 10-2010-0016560
Mar. 24, 2010  (KR) .................. 10-2010-0026164

(51) Int. Cl.
*C09K 11/02*    (2006.01)
(52) U.S. Cl.
USPC .................................................. 252/301.36
(58) Field of Classification Search
USPC .............. 252/301.16, 301.36, 582; 359/722, 359/798, 800; 257/779, 79, 100; 313/503, 313/512

See application file for complete search history.

(56) References Cited

U.S. PATENT DOCUMENTS

| 5,952,681 | A | 9/1999 | Chen |
| 5,998,925 | A | 12/1999 | Shimizu |
| 2003/0080341 | A1* | 5/2003 | Sakano et al. .................. 257/79 |
| 2008/0128654 | A1* | 6/2008 | Oshio .................... 252/301.4 R |
| 2009/0269579 | A1* | 10/2009 | Minaki ......................... 428/338 |
| 2010/0079701 | A1* | 4/2010 | Murayama et al. ............. 349/64 |
| 2010/0156268 | A1* | 6/2010 | Yoo et al. ...................... 313/487 |

FOREIGN PATENT DOCUMENTS

KR    10-0707908    4/2007

* cited by examiner

*Primary Examiner* — Emily Le
*Assistant Examiner* — Lynne Edmondson
(74) *Attorney, Agent, or Firm* — Occhiuti Rohlicek & Tsao LLP (57) ABSTRACT

A UV coating composition for LED color conversion including: 25 wt % to 97 wt % of a UV curable resin; and 3 wt % to 75 wt % of a phosphor. The composition enables emission of white light using only a white LED lens or a light guide plate without affecting a blue, violet or UV LED, thereby eliminating a need for a white LED. Further, users of a LED including the composition can perform direct and easy adjustment of the intensity of white light to obtain a desired intensity by replacing a conventional LED lens. The LED lens provides soft and comfortable lighting which effectively reduces glare caused by high brightness white LED lighting. Moreover, the composition slows deterioration of a lighting device and makes possible a light guide plate having a simple and thin structure.

8 Claims, 3 Drawing Sheets

UV COATING COMPOSITION FOR LED COLOR CONVERSION

CROSS REFERENCE TO RELATED APPLICATIONS

This application is a National Stage of International Application No. PCT/KR2010/005285, filed on Aug. 12, 2010, which claims priority to Korean Application No. 10-2010-0016560 filed Feb. 24, 2010, and Korean Application No. 10-2010-0026164 filed Mar. 24, 2010. The content of the prior applications are incorporated herein by reference in their entirety.

TECHNICAL FIELD

The present invention relates to a UV coating composition for LED (light emitting diode) color conversion. More particularly, the present invention relates to a UV coating composition for LED color conversion, which includes a phosphor for color conversion and, optionally, a light diffusing bead and/or a pigment, in a heat-resistant transparent UV-curable matrix resin to allow white light for lighting or a display device to be obtained through a simple and inexpensive structure from a high brightness blue LED, violet LED or UV LED having a long lifespan without using an expensive white LED having a relatively short lifespan and high brightness, which has a flat coating surface such that the phosphor for color conversion can be uniformly distributed and coated thereon, which can provide smoother and more comfortable illumination by effectively relieving glare due to high brightness of the LED when applied to lighting, and which permits compactness and structural simplification when applied to a display device.

BACKGROUND ART

An LED is a semiconductor device which converts electrical energy into light using characteristics of a semiconductor including specific compounds. The LED has various advantages, such as very small power consumption is due to high light conversion efficiency, appropriateness for miniaturization, slimming and weight reduction and unlimited applicability due to its small light source, semi-permanent and long lifespan (a blue, violet, or UV LED has a lifespan of about 100,000 hours, and a white LED has a lifespan of about 30,000 hours), very high response speed due to no need for pre-heating by elimination of the use of thermoluminescence or electroluminescence, a very simple lighting circuit, high impact resistance, safety and few environmental pollution factors due to no use of discharge gas and no filament, pulse operation at high repetition rate, reduction in visual fatigue, and realization of full color. Accordingly, the LED is widely used for light sources for liquid crystal display (LCD) backlights of mobile phones, camcorders, digital cameras, personal digital assistants (PDAs), etc., traffic lamps, electronic display boards, car headlights/taillights, display lamps of various kinds of electronic devices, office machines, facsimiles, etc., night lighting of remote controllers or surveillance cameras, infrared communication devices, information displays of outdoor advertising boards using various combinations of RGB pixels, ultra-precision displays of electronic display boards, and high-efficiency indoor/outdoor lighting. Particularly, as a high-brightness LED solving general problems of a conventional LED such as low brightness is commercially available, the use and application of the high-brightness LED have been rapidly expanded.

Particularly, since a white LED is very useful as a light source for an LCD backlight and indoor/outdoor lighting, usage has thereof rapidly increased. Also, just as fluorescent lamps drove incandescent lamps out of the market, it is expected that LED lamps will drive fluorescent lamps from the market.

A method for obtaining white light by an LED will be described hereinafter.

First, in a classical method for obtaining white light, three types of LEDs, that is, a red LED, a green LED, and a blue LED, are combined to obtain white light. However, this method has problems in that it requires a relatively high manufacturing cost, increases product size due to a complicated operating circuitry, and provides low optical characteristics and reliability of the product due to difference in temperature characteristics of the three LEDs, and thus is not substantially used at present.

Recently, in another method for obtaining white light, a white LED is selected as a single LED for generating white light. In this method, the surface of the white LED is coated with a phosphor, or the periphery of the LED or a lens is molded together with the phosphor such that the phosphor can be excited by light emitted from the LED and having a specific wavelength to generate light having a different wavelength. Then, the generated light is mixed with the light emitted from the single LED chip to generate white light.

However, in such a conventional method, the surface of a blue, violet or UV LED is directly coated with a phosphor, or the periphery of the LED or the lens is molded together with the phosphor. Thus, this method has a problem in that the lifespan of the LED is significantly reduced to one third or less due to LED degradation resulting from deterioration in heat dissipation. Particularly, when the phosphor is not evenly coated or dispersed, luminescent colors becomes non-uniform. However, it is very difficult to achieve uniform coating or dispersion/distribution of the phosphor.

As one of the most widely used white LEDs, U.S. Pat. No. 5,998,925 (Nichia Corp.) discloses a white LED, in which an InGaN-based blue LED emitting blue light having a wavelength of 450 nm is coated or molded with a yellow phosphor (generally, yttrium-aluminum-garnet:$Y_3Al_5O_{12}$:Ce, YAG-based compound) such that blue light emitted from the blue LED excites the YAG yellow phosphor to emit yellow light in a wide peak, thereby allowing light components in two different wavelength bands, that is, the narrow-peak blue light of the blue LED and the wide-peak yellow light of the YAG-based yellow phosphor, to be recognized as white light by human's eyes a viewer through complementary interference.

However, the white light results from a mixture of the light components, which have different wavelengths and are not in a complete completely complementary relationship, and thus has only part of a visible range spectrum. For this reason, the white light has a color rendering index (CRI) of about 60~75, and is generally not accepted as near-natural white light. Thus, it does not satisfy requirements for general indoor lighting. Also, the white LED has a problem of low brightness, because the blue LED shows the highest efficiency by excitation light at a wavelength of about 405 nm whereas the YAG-based phosphor is excited by blue light in a wavelength band of 450~460 nm. Particularly, in coating or molding of the YAG-based phosphor, it is difficult to guarantee homogeneous and uniform dispersibility, thereby deteriorating uniformity and reproducibility of products in terms of brightness and spectral distribution of white light, and significantly reducing the lifespan of the LED.

In order to overcome the problems of the white LED including the blue LED and the YAG-based phosphor, U.S.

Pat. No. 5,952,681 (Solidlite Corp.) discloses a technology for obtaining three-wavelength, high-CRI and near-natural white light by combining red, green and blue phosphors, and using a high brightness UV LED, which emits light in a wavelength band of 250 nm to 390 nm as an excitation light source. However, the use of the white LED has a problem in that the blue and green phosphors have satisfactory light emission efficiency while the red phosphor has low light emission efficiency. Particularly, the UV LED tends to deteriorate an organic resin by UV having a strong energy, thereby significantly reducing the lifespan of the LED.

In another type of white LED (Solidlite Corp.), a violet LED emitting light in a wavelength band of 390 nm to 410 nm is used and white light is obtained by combining red, blue, and green phosphors. The high brightness violet LED is commercially available from Cree Corporation (U.S.), and is known to emit a relatively natural three-wavelength band white light through uniform light emission from red, blue, and green phosphors excited by violet light in a wavelength band of 390 nm to 410 nm.

Factors affecting the characteristics of white light emitted from a white LED may include the intensity of the light, combination applicability of the light emitted from the LED and light converted by a phosphor, and the components, content and dispersed state of the phosphor. These factors have a significant influence on the emitted light. Particularly, white light emitted by combination of the blue LED and the YAG-based phosphor may have a problem in that the emitted color is generally biased to blue or yellow color due to difficulty in adjustment of the amount of a yellow phosphor and uniform dispersion thereof.

In order to obtain a white LED having excellent luminescent characteristics, it is necessary for a phosphor to be evenly dispersed in a light-transmitting matrix resin. However, in a fabrication process, before the matrix resin is completely hardened, a phosphor having a much higher specific gravity (the phosphor has a specific gravity of about 3.8~6.0, although it depends on the kind of the phosphor) than the matrix resin is precipitated in a lower region of the light-transmitting matrix resin having a low specific gravity (for example, an epoxy resin has a specific gravity of about 1.1~1.5), thereby making it difficult to obtain white light having excellent luminescent characteristics. Furthermore, it is not easy to precisely control the degree of dispersion of the phosphor. Accordingly, it is not easy to fabricate a high-quality white LED device and fabrication reproducibility is not good.

Meanwhile, an LED lighting device includes an LED lens, which allows light components diffused and emitted from an LED upon application of voltage to be directed as parallel light beams and can increase the intensity of radiation through a viewing angle. In addition, the viewing angle is adjusted by controlling curvatures of a light-incident lower surface and a light-emitting upper surface of the lens, and the lens can be suitably selected and used according to various shapes and sizes of lenses based on various parameters, such as the kind and power of a used LED, use purpose, an end user preference, desired intensity of lighting, and the like.

Figure 1:
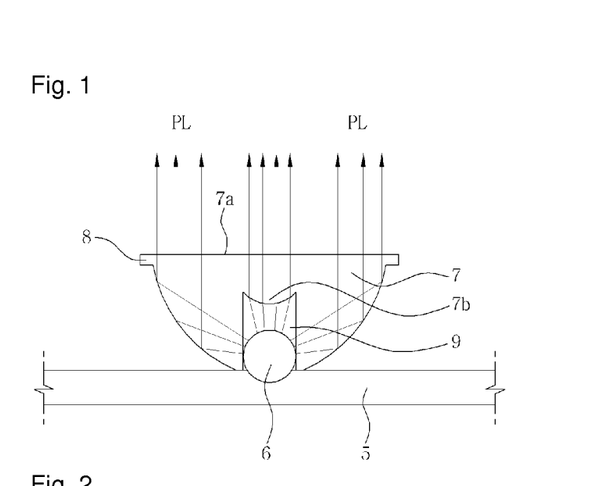
FIG. 1 is a sectional view of a conventional LED lens

FIG. 1 is a sectional view of a conventional LED lens. The conventional LED lens generally has a hemispherical shape with a wide upper section and a narrow lower section, without being limited thereto. The LED lens includes an upper surface 7a having an annular lateral portion 7 and a flange 8, and is formed on a lower surface thereof with a cylindrical LED mounting portion 9. The LED mounting portion 9 may have a flat shape, but is generally formed with an internally convex portion 12 for collection of light.

The upper surface 7a of the LED lens may have a pectination shape, a plurality of dots, or a smooth planar shape in order to provide soft illumination. Also, the upper surface of the LED lens may have an opening at the center thereof. The lateral portion 7 may have various angle-gradients and lengths for adjustment of an irradiation angle. Further, the upper surface 7a may be formed into a forwardly projecting convex shape, a flat shape, a concave shape, or other specific shapes.

Reference numeral 5 denotes a substrate and reference numeral 6 denotes a light diffusing lens for LED molding.

Figure 2:
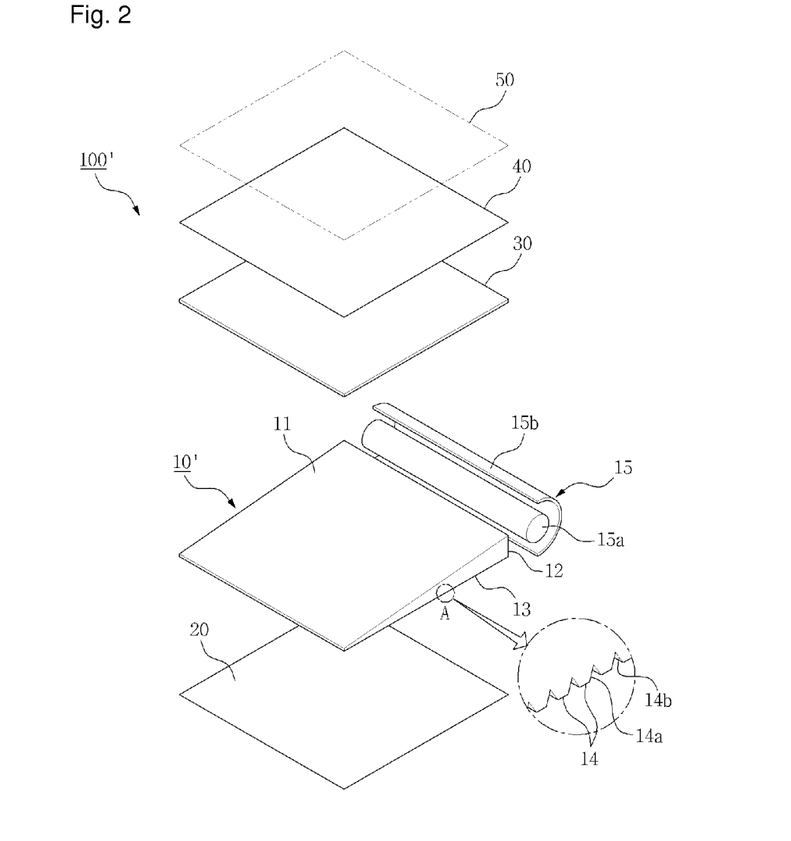
FIG. 2 is an exploded perspective view of a conventional edge-type backlight unit.

FIG. 2 is an exploded perspective view of a conventional edge-type backlight unit. The conventional backlight unit 100' generally includes a light source 15a, a light guide plate 10' having one end facing the light source 15a, a reflective sheet 20 disposed below the light guide plate 10', a prism sheet 30 disposed above the light guide plate 10', a light diffusing sheet 40 disposed above the prism sheet 30, and a protective sheet 50 disposed above the light diffusing sheet 40.

More specifically, a light source 15 includes a linear light source 15a or a white LED (not shown) and a reflective plate 15b, and is located adjacent to a thick side surface of the light guide plate 10' that generally has a tapered shape. The reflective sheet 20 is located below the light guide plate 10', and the prism sheet 30, the light diffusing sheet 40 and the protective sheet 50 are sequentially stacked on an upper surface of the light guide plate 10'. The prism sheet 13 has a pattern of plural prisms (not shown) parallel to each other.

The light guide plate 10' is formed with a light exiting surface 11 on an upper surface thereof and has a lower surface 13 adjoining the reflective sheet 20. A flat light entering surface 12 is formed on one side surface of the light guide plate adjacent to the light source 15, and the lower surface 13 of the light guide plate 10' is formed with a pattern of plural prisms 14 each having prism slopes 14a, 14b and parallel to each other in a direction orthogonal to a traveling direction of light emitted from the light source 15.

Here, light emitted from the light source 15 is received by the flat light entering surface 12 and is scattered by the prism slopes 14a, 14b of the prisms 14 under the light guide plate 10'. Then, the light is emitted toward the prism sheet 30 through the light exiting surface 11 of the light guide plate 10' and is scattered again by the prism sheet 30 having the pattern of plural prisms (not shown) orthogonal to the pattern of prisms 14, which is formed on the lower surface 13 of the light guide plate 10'. Then, the light is converted into uniform light and output through the light diffusing sheet 40.

Since the light diffusing sheet 40 serves to convert incident light into uniform light over the entire area of a display panel through diffusion and scattering, stacking the light diffusing sheet 40 on the prism sheet 30 makes it difficult to reduce the thickness of the backlight unit and increases the number of processes and components, causing deterioration in economic feasibility and process efficiency.

DISCLOSURE

Technical Problem

Therefore, it is an object of the present invention to achieve significant increase in lifespan of an LED lighting device for emission of white light, in which a high brightness LED having a long lifespan (lifespan of about 100,000 hours), such as a blue LED, a violet LED, and optionally a UV LED, is used to provide while light for lighting or for a display device through a hard thin film for surface protection, instead of a conventional high brightness white LED having a relatively short lifespan (lifespan of about 30,000 hours).

It is another object of the present invention to allow a user or an operator, instead of a manufacturer, to perform direct and easy adjustment of the intensity of white light to a desired intensity at low cost, or to obtain soft white light through a relatively inexpensive LED, such as a blue LED, a violet LED or a UV LED, instead of a conventional expensive high brightness white LED.

It is a further object of the present invention to achieve effective and easy removal of a possibility of non-uniformity in emitted colors resulting from non-uniform distribution or coating of a phosphor for light conversion.

It is yet another object of the present invention to obtain soft and comfortable lighting by effectively reducing glare caused by high brightness white LED lighting.

It is yet another object of the present invention to reduce a possibility of deterioration of a lighting device by ensuring high heat resistance.

It is yet another object of the present invention to provide a backlight unit having a thin and simple structure and high durability using a light guide plate for color conversion.

Technical Solution

The above and other objects of the present invention can be achieved by the provision of a UV coating composition for LED color conversion, which include 25~97 percent by weight (wt %) of a UV-curable resin, preferably 40~95 wt % of the UV curable resin, and 3~75 wt % of a phosphor for color conversion, preferably 5~60 wt % of the phosphor for color conversion.

In addition, the above and other objects of the present invention can be achieved by the provision of a UV coating composition for LED color conversion, which include: 25~96.99 wt % of a UV-curable resin, preferably 45~94.99 wt % of the UV-curable resin; 3~65 wt % of a phosphor for color conversion, preferably 5~50 wt % of the phosphor for color conversion; and 0.01~10.0 wt % of light diffusing beads having an average particle diameter of 0.2~30 μm, preferably an average particle diameter of 0.5~5 μm, specifically an average particle diameter of 1.0~3.5 μm, preferably 0.01~5.0 wt % of the light diffusing beads.

The UV coating composition for LED color conversion may further include 0.1~3.0 wt % of a pigment, preferably 0.1~1.0 wt % of the pigment.

The UV-curable resin may include at least one selected from the group consisting of urethane acrylate, epoxy acrylate, polyester acrylate, and acryl acrylate resins.

Advantageous Effects

With the UV coating composition for LED color conversion according to the present invention, a lighting device can emit white light, as in a conventional white light LED, independently using only a white LED lens or a light guide plate without affecting a blue, violet or UV LED, thereby eliminating a need for a white LED which is relatively expensive and has a short lifespan of about ⅓ that of other kinds of LEDs. Further, when the lighting device employs a conventional blue, violet, or UV LED having a long lifespan, the UV coating composition of the present invention allows the lighting device to obtain white light by simply and easily replacing a lens. Thus, an LED lens comprising the UV coating composition of the present invention allows a user or an operator, instead of a manufacturer, to perform direct and easy adjustment of the intensity of white light to a desired intensity by replacing a conventional LED lens, and makes it possible to provide soft and comfortable lighting by effectively reducing glare caused by high brightness white LED lighting. Furthermore, the UV coating composition of the present invention may provide a backlight unit having a simple and thin structure for a display device and may reduce a possibility of deterioration of a lighting device or a display device by ensuring high heat resistance, thereby providing high efficiency and economic feasibility.

BEST MODE

Embodiments of the present invention will now be described in more detail.

First, a coating layer 1 comprised of a UV coating composition for LED color conversion according to the present invention will be described with reference to referring to FIG. 4. Herein, the UV coating composition for LED color conversion according to the present invention may often refer to the UV coating layer 1 for LED color conversion.

As for a UV-curable matrix resin 2, any UV-curable resin having good transparency and heat-resistance may be advantageously used without limitation. Examples of the heat-resistant, transparent UV-curable matrix resin 2 may include urethane acrylate, epoxy acrylate, polyester acrylate, acryl acrylate, and mixtures thereof. The heat-resistant, transparent matrix resin may be present in an amount of 25~97 wt %, preferably 40~95 wt %, based on the total amount of the UV coating composition.

If the amount of the heat-resistant, transparent UV-curable matrix resin 2 is less than 25 wt % based on the total amount of the UV-curable composition, the composition can be deteriorated in transparency and significantly reduce brightness due to a backlighting effect caused by scattering. On the other hand, if the amount of the heat-resistant, transparent matrix resin exceeds 97 wt %, the effect of emitting white light through color conversion can become insufficient, thereby deteriorating color quality of the lighting or display device.

All of the examples of the UV-curable matrix resin 2 described above are typical heat-resistant, transparent resins which allow polymerization upon UV irradiation, and elaboration thereof will be omitted herein.

Meanwhile, in the present invention, when a blue LED is used, only YAG-based yellow phosphors known in the art may be used as phosphors 3c, 4c for converting a lighting color into a white color. In this case, a green phosphor and a red phosphor are preferably used since the green and red phosphors can provide a three-wavelength band natural white light. Also, when a violet LED or a UV LED is used, a green phosphor, a red phosphor, and a blue phosphor are preferably used for the same reason.

For a white LED using a blue LED and a YAG yellow phosphor, typical examples of the YAG yellow phosphor include $(YGd)_3Al_5O_{12}$:Ce or $Sr_2Ga_2S_5$:Eu$^{2+}$ developed by Nichia Corp. The YAG yellow phosphor is generally excited by light at a wavelength of 550~560 nm.

Meanwhile, when a blue LED (emitting light in a wavelength band from 425 nm to 475 nm), a green phosphor, a red phosphor, and a blue phosphor are used, examples of the red phosphor capable of being excited by light in a wavelength band from 430 nm to 480 nm may include $Y_2O_2S$:Eu,Gd, $Li_2TiO_3$:Mn, $LiAlO_2$:Mn, $6MgO.As_2O_5$:Mn$^{4+}$, and $3.5MgO.0.5MgF_2.GeO_2$:Mn$^{4+}$, and examples of the green phosphor capable of being excited by light in a wavelength band from 515 nm to 520 nm may include ZnS:Cu,Al, $Ca_2MgSi_2O_7$:Cl, $Y_3(Ga_xAl_{1-x})_5O_{12}$:Ce (0<x<1), $La_2O_3.11Al_2O_3$:Mn, $Ca_8Mg(SiO_4)_4C_{12}$:Eu, Mn, without being limited thereto.

A three-wavelength band white LED employing a blue LED, and red and green phosphors emits three-wavelength band white light by generating red light and green light through excitation of a mixture of the red and green phosphors such that the red light and the green light are mixed with blue light from the blue LED.

In addition, the red and green phosphors capable of being excited by the blue LED are oxides and have high stability and long lifespan.

In the present invention, it should be noted that the three-wavelength band white light is obtained by forming the UV coating layer 1 for LED color conversion on a flat upper surface 7a of an LED lens or on a flat light entering surface 12 and/or a light exiting surface 11 of a light guide plate 10, 10a or 10b of a display device irrespective of the LED, instead of directly or indirectly coating a suitable mixture of the green phosphor and the red phosphor on the blue LED.

When the UV coating layer 1 for LED color conversion is applied to the light guide plate 10, 10a or 10b, particularly, to the light entering surface of the light guide plate, there are various advantages such as economic feasibility due to reduction in amounts of phosphors, environmental friendliness due to generation of substantially no volatile organic compounds, higher productivity than thermosetting type resins, high scratch resistance of the coating layer, and easy provision of anti-electrostatic or anti-fouling properties through addition of an anti-static agent or anti-fouling agent known in the art, as needed.

The red phosphor may be $Li_2TiO_3$:Mn at a luminescent peak wavelength of about 659 nm, $LiAlO_2$:Mn at a luminescent peak wavelength of about 670 nm, $6MgO.As_2O_5$:Mn$^{4+}$ at a luminescent peak wavelength of about 650 nm, and $3.5MgO.0.5MgF_2.GeO_2$:Mn$^{4+}$ at a luminescent peak wavelength of about 650 nm.

The green phosphor may be $La_2O_3.11Al_2O_3$:Mn at a luminescent peak wavelength of about 520 nm, $Y_3(GaAl_1\text{-}x)_5O_{12}$:Ce (0<x<1) at a luminescent peak wavelength of about 516 nm, and $Ca_8Mg(SiO_4)_4Cl_2$:Eu, Mn at a luminescent peak wavelength of about 515 nm.

The red and green phosphors may be mixed in various ratios, and may form a neutral color LED, such as a pink or blue/white LED. Meanwhile, the blue LED may be an InGaN, SiC, or ZnSe-based LED.

Meanwhile, the violet LED or the UV LED may employ $BaMgAl_{10}O_{17}$ or $(Sr,Ca,BaMg)_{10}(PO_4)_6Cl_2$:Eu as a blue phosphor as well as the green and red phosphors as described above.

Through a suitable combination of the red, blue, and green phosphors, it is possible to obtain white light or various colors, or obtain various colors having different color temperatures.

Of course, the obtained white light may be suitably adjusted within a range of 3200~7500K through a suitable combination of the red, blue, and green phosphors according to characteristics of the lighting device or the display device.

The red phosphor, the blue phosphor, the green phosphor, or a mixture 3c, 4c thereof is present in an amount of 3~75 wt %, preferably 5~60 wt %, based on the total weight of the composition. The blue LED may employ the red phosphor and the green phosphor in a weight ratio of 1:0.2~1.2, and preferably in a weight ratio of 1:0.3~0.8. The violet LED or the UV LED may employ the red phosphor, the blue phosphor, and the green phosphor in a weight ratio of 1:0.2~1.2: 0.2~1.2, and preferably in a weight ratio of 1:0.3~0.8:0.3~0.8.

If the phosphor 3c, 4c is included in an amount of less than 3.0 wt % based on the total weight of the composition, satisfactory white light may not be obtained. On the other hand, if the amount of the phosphor exceeds 60 wt %, it is disadvantageous in terms of economic feasibility and brightness can be significantly reduced.

Optionally, the composition according to the present invention may further include light diffusing beads 3b, 4b. Examples of the light diffusing beads may include: organic light diffusing beads, such as a homopolymer or a copolymer of monomers, selected from the group consisting of a silicon resin (index of refraction: 1.43), polyacrylate (index of refraction: 1.49), polyurethane (index of refraction: 1.51), polyethylene (index of refraction: 1.54), polypropylene (index of refraction: 1.46), Nylon (index of refraction: 1.54), polystyrene (index of refraction: 1.59), polymethylmethacrylate (index of refraction: 1.49), and polycarbonate (1.59); inorganic light diffusing beads, such as silica (index of refraction: 1.47), alumina (index of refraction: 1.50~1.56), glass (index of refraction: 1.51), $CaCO_3$ (index of refraction: 1.51), talc (index of refraction: 1.56), mica (index of refraction: 1.56), $BaSO_4$ (index of refraction: 1.63), ZnO (index of refraction: 2.03), $CeO_2$ (index of refraction: 2.15), $TiO_2$ (index of refraction: 2.50~2.71), iron oxide (index of refraction: 2.90); and mixtures thereof.

The light diffusing beads 3b and 4b may have an average particle diameter of 0.2~30 μm, preferably 0.5~5 μm, specifically 1.0~3.5 μm, and may be present in an amount of 0.01~10.0 wt %, preferably 0.01~5.0 wt %, more preferably 0.01~2.0 wt %, based on the total weight of the composition.

If the average particle diameter of the light diffusing beads 3b, 4b is less than 0.2 μm, the composition can be reduced in transparency or light transmittance. On the contrary, if the average particle diameter of the light diffusing beads exceeds 30 μm, excitation of the phosphor can become insufficient or non-uniform.

If the light diffusing beads 3b, 4b are present in an amount of less than 0.01 wt % based on the total weight of the composition, excitation of the phosphor can become insufficient or non-uniform. On the contrary, if the light diffusing beads are present in an amount of greater than 10.0 wt %, the composition can be reduced in transparency or light transmittance.

When the light diffusing beads having an average particle diameter of 0.2~30 μm, preferably 0.5~5 μm, specifically 1.0~3.5 μm, is present in an amount of 0.01~10.0 wt %, preferably 0.01~5.0 wt %, the amount of the UV-curable matrix resin 2 is controlled in the range of 25~96.99 wt %, preferably 45~94.99 wt %, and the amount of the phosphor 3c, 4c is controlled in the range of 3~65 wt %, preferably 5~50 wt %.

Particularly, in order to obtain homogenous exhibition of white light through the UV coating layer 1 for LED color conversion, a mixture of the light diffusing beads having average particle diameters of 1~4 μm, 5~10 μm and 11~30 μm and mixed in a weight ratio of 1:0.4~0.8:0.1~0.3 may be used.

Optionally, the composition according to the present invention may further include an organic or inorganic pigment in order to control a color of the lighting device or the display device. The organic or inorganic pigment may be present in an amount of 0.1~3.0 wt %, preferably 0.1~1.0 wt %. Advantageously, the organic pigment is used in view of transparency. Examples of pigments include nitro pigments, azo pigments, indanthrone pigments, thioindigo pigments, perylene pigments, dioxazine pigments, quinacridone pigments, phthalocyanine pigments, quinophthalone pigments, and the like, without being limited thereto. For example, a yellow pigment for providing warmth may be selected from among monoazo, diazo, naphthalazobenzene, cork tree, goldthread, and mixtures thereof, without being limited thereto.

Meanwhile, although there is no limitation to the thickness of the UV coating for LED color conversion according to the present invention, the UV coating generally has a thickness of 1~250 μm, preferably 3~100 μm.

Figure 3:
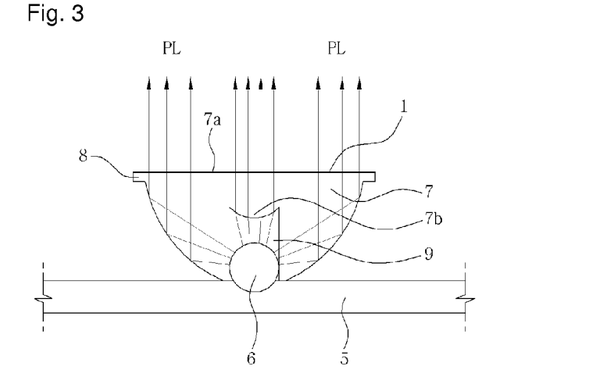
FIG. 3 is a cross-sectional view of an LED lens including a UV coating composition for LED color conversion according to the present invention applied to an upper surface thereof.
Figure 5:
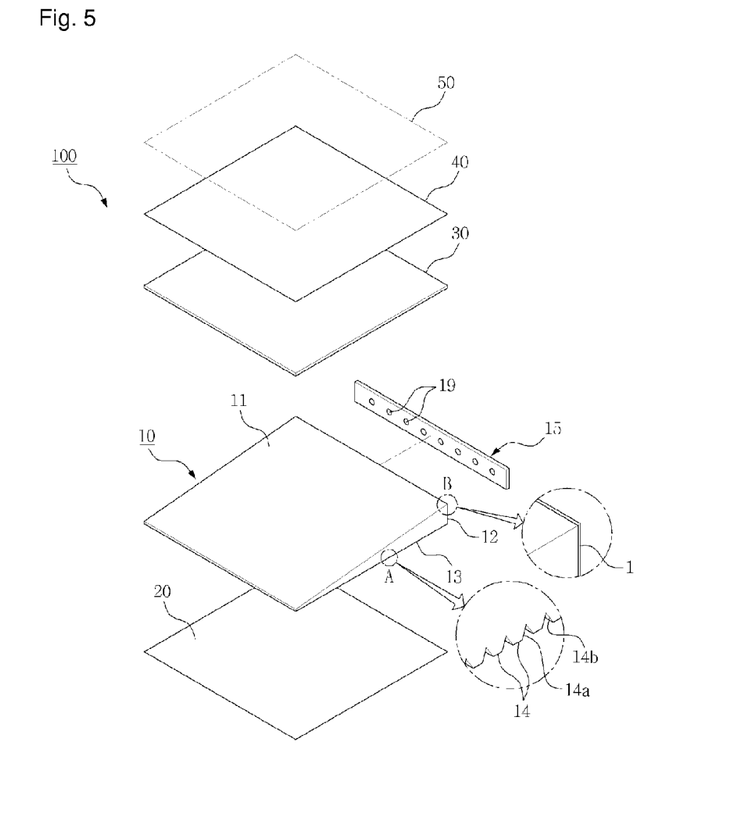
FIG. 5 to FIG. 7 are perspective views of embodiments of a backlight unit including a light guide plate having a UV coating layer of the UV coating composition for LED color conversion according to the present invention on a light entering or exiting surface of the light guide plate.
Figure 6:
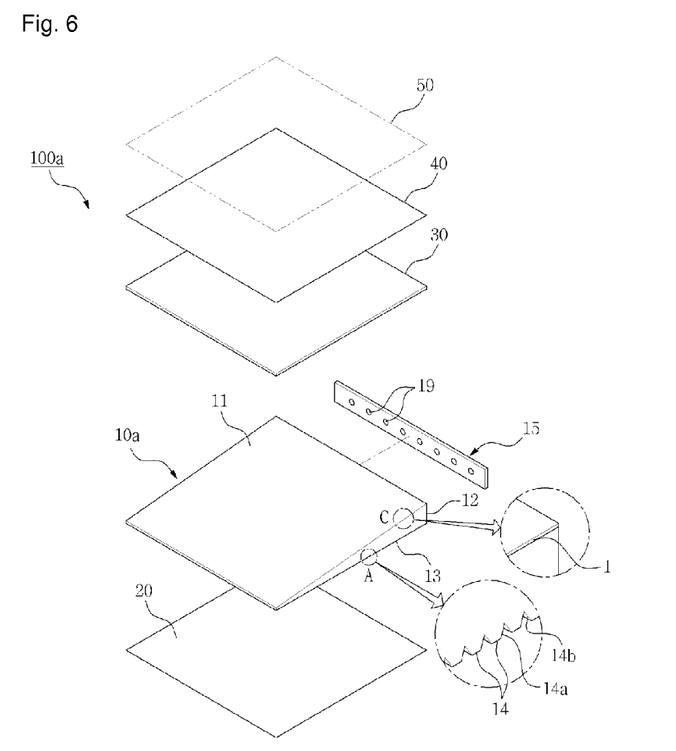

Next, one embodiment of the invention wherein the UV coating composition for LED color conversion is realized as a coating layer 1 will be described in more detail with reference to FIG. 3 illustrating an LED lens and FIGS. 5 and 6 illustrating light guide plates 10, 10a, 10b.

FIG. 3 is a cross-sectional view of an LED lens 10 including a UV coating layer 1 for LED color conversion according to the present invention formed on a flat upper surface 7a thereof.

The LED lens according to the present invention has a hemispherical shape with a wide upper section and a narrow lower section, without being limited thereto. The LED lens is a typical epoxy LED lens, which includes a flat upper surface 7a having an annular lateral portion 7 and a flange 8 and is formed on a lower surface thereof with a cylindrical LED mounting portion 9. The LED mounting portion 9 is formed at an upper portion thereof with an internally convex portion 7b. In addition, a UV coating composition for LED color conversion is coated on the flat upper surface 7a to form a coating layer 1, thereby allowing change of an emitted color to be simply and easily carried out only by inserting a suitable LED lens 10 of the present invention having the UV coating layer 1 for LED color conversion, irrespective of a predetermined color emitted from a blue LED, a violet LED, a UV LED, or a white LED.

In addition, the upper surface of the LED lens may have a pectination shape, a plurality of dots, or a smooth planar shape in order to provide soft illumination. Also, the upper surface of the LED lens may have an opening at the center thereof as needed, a forwardly projecting convex shape, a flat shape, a concave shape, or other shapes. In this invention, the coating layer preferably has a flat surface in order to ensure uniform distribution of phosphors for color conversion.

Referring again to FIG. 4, a phosphor(s) 3c and/or 4c, light diffusing beads 3b and/or 4b, and a pigment(s) 3a and/or 4a are evenly dispersed in a UV-curable matrix resin 2.

Figure 4:
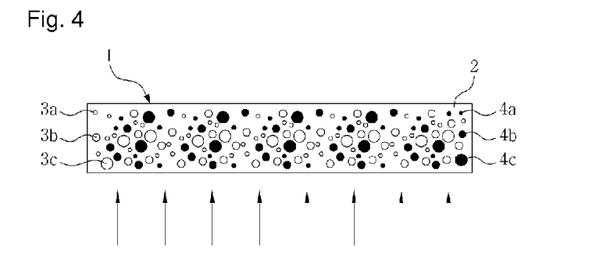
FIG. 4 is a view of a coating layer of the UV coating composition for LED color conversion according to the present invention.

As can be seen from FIG. 4, the UV coating composition 1 for LED color conversion may be independently applied to the LED lens or light guide plate without affecting the LED, such that a color emitted from the LED can be easily and simply converted into white light from blue, violet or UV light. Furthermore, scattering by the light diffusing beads 3b and/or 4b allows the phosphor(s) 3c and/or 4c to sufficiently carry out conversion of the emitted color. Thus, the phosphor can be very uniformly distributed without any problem while significantly reducing or relieving glare or visual fatigue caused by high brightness of the LED when a user directly views the light source.

FIG. 5 is an exploded perspective view of one embodiment of a backlight unit 100 including a light guide plate 10 having a coating layer 1 (see an enlarge portion "B"), which is formed on a light entering surface 12 thereof and is comprised of the UV coating composition for LED color conversion according to the present invention. Referring to FIG. 6, the backlight unit 10 includes a light source 15 including a plurality of LEDs 19, which consist of one kind of LED selected from among blue, violet and UV LEDs, a light guide plate 10 having the light entering surface facing the light source 15, a reflective sheet 20 disposed below the light guide plate 10, and a prism sheet 30, a light diffusing sheet 40 and a protective sheet 50 sequentially stacked on an upper surface of the light guide plate 10 constituting a light exiting surface 11.

FIG. 6 is an exploded perspective view of one embodiment of a backlight unit 100a including a light guide plate 10a having a coating layer 1 (see an enlarge portion "C"), which is formed on a light exiting surface 11 thereof and is comprised of the UV coating composition for LED color conversion according to the present invention. The backlight unit of FIG. 6 is substantially the same as that shown in FIG. 5 except for the location of the coating layer 1 comprised of the UV coating composition for LED color conversion, and thus no further elaboration thereof is needed.

In the embodiments described above, as shown in an enlarged portion "A" of FIG. 6, a pattern of prisms 14 each including prism slopes 14a, 14b is formed on a lower surface 13 of the light guide plate 10 or 10a.

Figure 7:
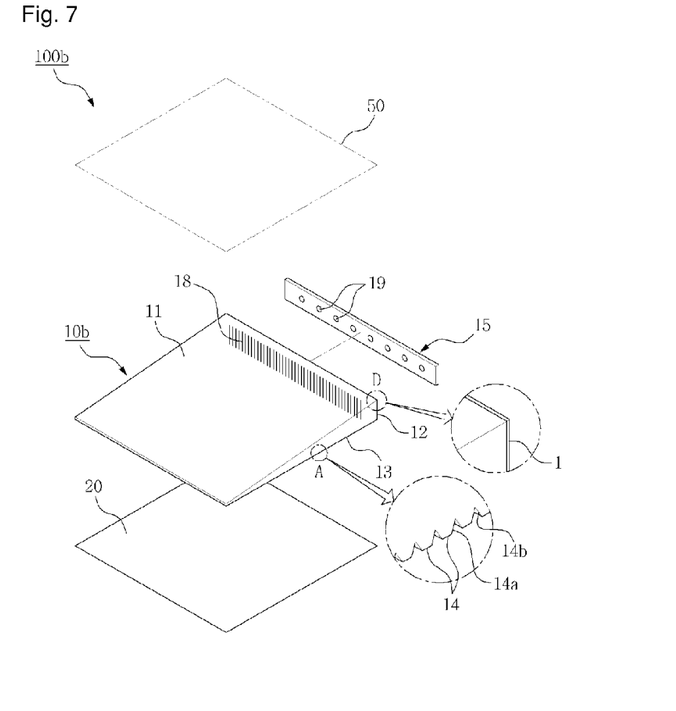

FIG. 7 is an exploded perspective view of one embodiment of a backlight unit 100b including a light guide plate 10b having a coating layer 1 (see an enlarge portion "D"), which is formed on a light entering surface 12 thereof and is comprised of the UV coating composition for LED color conversion according to the present invention. In this backlight unit, the light guide plate 10b has a pattern of internal prisms 18, which are formed on an inner region thereof near the light entering surface 12 by laser processing and comprise a plurality of longitudinal slits separated from each other to be parallel to each other. In this embodiment, the backlight unit 100b includes a light source 15 including a plurality of LEDs 19, which consist of one kind of LED selected from among blue, violet and UV LEDs, the light guide plate 10b including the light entering surface 12, which has a UV coating layer 1 for color conversion and faces the light source 15, a reflective sheet 20 disposed below the light guide plate 10b, and a protective sheet 50 disposed on an upper surface of the light guide plate 10b constituting a light exiting surface 11. Except for these components, the backlight unit 100b is substantially the same as that of the other backlight units.

Therefore, in the backlight units 100, 100a, 100b each including the UV coating composition for LED color conversion or the coating layer 1 according to the present invention as shown in FIGS. 5 to 7, there is no need for use of a white LED which is relatively expensive and has a short lifespan, and relatively inexpensive LEDs having a long lifespan, such as blue LEDs, violet LEDs, or UV LEDs, may be used as the light source, such that a predetermined color can be converted into white light through the coating layer 1 comprised of the UV coating composition for LED color conversion, thereby ensuring a long lifespan of the LED while increasing economic feasibility.

In FIG. 6, the backlight unit is shown as including all of the prism sheet 30, the light diffusing sheet 40, and the protective sheet 50. However, when the UV coating layer 1 for LED color conversion includes the light diffusing beads 3b, 4b, the UV coating layer 1 may serve to perform the functions of the light diffusing sheet 140 and the protective sheet 150, and the prism sheet 130 is not an essential component for the backlight unit 100. Therefore, all of these components can be omitted from the backlight unit. As needed, with the prism sheet 30 attached to the backlight unit, a UV coating layer 1 comprising the light diffusing beads 3b, 4b is formed on the light exiting surface 11, whereby the backlight unit 100a can be formed to have a thin and simple structure, thereby providing good durability and economic feasibility through reduction of manual labor and the number of components.

Further, in FIG. 7, the light guide plate 10b has the pattern of internal prisms 18, which are vertically formed on the inner region thereof near the light entering surface 12 by focusing laser beams emitted from a well-known laser oscillator to be parallel to each other while being separated from each other in a longitudinal direction, such that the pattern of internal prisms 18 thinly and uniformly distributes light emitted from the light sources 19 in a transverse direction orthogonal to the light sources 19 and a surface light source of uniform brightness can be exhibited on the light exiting surface 11 by the pattern of prisms 14 formed on the lower surface 13 of the light guide plate 10b.

In this embodiment, since the pattern of internal prisms 18 is formed inside the light guide plate 10b, the light entering surface 12 has a flat surface. Thus, the UV coating composition 1 containing the phosphor can be uniformly and easily coated on the light guide plate 10b, with the phosphor uniformly dispersed therein.

The light guide plates 10, 10a, 10b may be formed of any well-known heat-resistant, transparent resin, such as acryl, polycarbonate, and polymethyl (meth)acylate, crystal, glass, and the like.

Further, in the backlight unit 100b of FIG. 7, the light guide plate 10b includes the coating layer 1 formed by coating the UV coating composition for LED color conversion on the flat light entering surface 12 thereof, the pattern of internal prisms 18 formed on the inner region thereof near the light entering surface 12, and the pattern of prism 14 formed on the lower surface 13 thereof, so that only the protective sheet 50 can be stacked on the light exiting surface 11, thereby providing a backlight unit 100b having a thin and simple structure. However, it should be understood that the present invention is not limited to this configuration. Alternatively, instead of the protective sheet 50, another coating layer 1a comprised of the UV coating composition for LED color conversion containing light diffusing beads may be further formed on the light exiting surface 111 in order to serve as the light diffusing sheet and the protective sheet, whereby the backlight unit can be significantly reduced in thickness and have a simple structure, thereby providing good durability and economic feasibility through reduction of manual labor and the number of components.

Any kind of photoinitiator may be used for the composition according to the present invention. Examples of the photoinitiator may include alpha-hydroxyketone, phenylglyoxylate, alpha-aminoketone, butyldihydroxyketone, an acylphosphine oxide, and the like, which are widely used for UV-curable hard coating. Preferably, alpha-hydroxyketone or phenylglyoxylate is used as the photoinitiator in terms of light-transmitting properties. The photoinitiator may be added in an amount of 0.1~8 wt %, and more generally 0.1 to 4 wt %, based on the total weight of the UV-curing resin. It should be understood that since selection and the amount of these photoinitiators are well known in the art, the amount of the photoinitiator is illustrated here as being included in the weight of UV-curable resin without detailed consideration thereof.

Further, the UV hard coating layer may be cured using a mercury lamp or a xenon lamp with an exposure of 700~1300 mJ, generally an exposure of 700~1000 mJ, at a wavelength of 350~400 nm for about 1~60 seconds, generally for about 10~30 seconds.

Hereinafter, the present invention will be described in more detail with reference to examples.

Example 1

First, an LED lens was formed using an epoxy resin through injection molding, as shown in FIG. 3. Then, a mixture of 92 wt % of an epoxy acrylate monomer and an oligomer (containing 3.5 wt % of alpha-hydroxyketone as a photoinitiator) and 8 wt % of $(YGd)_3Al_5O_{12}:Ce$ as a yellow phosphor was deposited on an upper surface of the LED lens and subjected to irradiation using a xenon lamp with an exposure of 890 mJ for 30 seconds, thereby forming a 58 μm thick UV coating layer for LED color conversion.

The prepared LED lens was mounted on a blue LED. Upon operation of the LED, slightly yellowish white light was obtained.

Example 2

An LED lens was formed using an epoxy resin through injection molding, and a mixture of 92 wt % of an epoxy acrylate monomer and an oligomer (containing 3.5 wt % of alpha-hydroxyketone as a photoinitiator), 6 wt % of $(YGd)_3Al_5O_{12}:Ce$ as a yellow phosphor, and 2 wt % of polymethyl (meth)acrylate having an average particle diameter of 2.0 μm (index of refraction: 1.50, light transmittance: 91%) as light diffusing beads was deposited on an upper surface of the LED lens and subjected to irradiation using a xenon lamp with an exposure of 890 mJ for 30 seconds, thereby forming a 85 μm thick UV coating layer for LED color conversion.

The prepared LED lens was mounted on a blue LED. Upon operation of the LED, white light was obtained.

Example 3

A UV coating layer for LED color conversion was formed on a flat upper surface of an epoxy LED lens by the same method as in Example 1, except that a mixture of 87 wt % of an urethane acrylate monomer and an oligomer (containing 1.8 wt % of phenylglyoxylate as a photoinitiator), 7 wt % of $Y_2O_2S:Eu,Gd$ as a red phosphor, 3 wt % of $ZnS:Cu,Al$ as a green phosphor, and 3 wt % of polymethyl (meth)acrylate having an average particle diameter of 2.0 μm as light diffusing beads was deposited on the flat upper surface of the LED lens.

The prepared LED lens was mounted on a blue LED. Upon operation of the LED, white light was obtained.

Example 4

A UV coating layer for LED color conversion was formed on a flat upper surface of an epoxy LED lens by the same method as in Example 1, except that a mixture of 92.5 wt % of an acryl acrylate monomer and an oligomer (containing 1.5 wt % of phenylglyoxylate as a photoinitiator), 3 wt % of $LiAlO_2$:Mn as a red phosphor, 2 wt % of $Y_3(Ga_xAl_{1-x})_5O_{12}$:Ce (0<x<1) as a green phosphor, 1 wt % of $BaMgAl_{10}O_{17}$ as a blue phosphor, and 1.5 wt % of polymethyl (meth)acrylate having an average particle diameter of 2.0 µm as light diffusing beads was deposited on the flat upper surface of the LED lens.

The prepared LED lens was mounted on a violet LED. Upon operation of the LED, white light was obtained.

Example 5

On a light entering surface of a light guide plate as shown in FIG. 5, a mixture of 95 wt % of a polyester acrylate monomer and an oligomer (containing 2.5 wt % of alpha-hydroxyketone as a photoinitiator) and 5 wt % of $Sr_2Ga_2S_5$:$Eu^{2+}$ as a yellow phosphor was deposited and subjected to irradiation using a xenon lamp with an exposure of 1000 mJ for 20 seconds, thereby forming a 96 µm thick UV coating layer for LED color conversion.

When operating a backlight unit including the prepared light guide plate and a blue LED, white light was obtained.

Example 6

On a light exiting surface of a light guide plate as shown in FIG. 6, a mixture of 88 wt % of an epoxy acrylate monomer and an oligomer (containing 3.5 wt % of alpha-hydroxyketone as a photoinitiator), 5 wt % of $Li_2TiO_3$:Mn as a red phosphor, 4 wt % of $Ca_2MgSi_2O_7$:Cl as a green phosphor, and 3 wt % of polycarbonate having an average particle diameter of 3.0 µm (index of refraction: 1.59) as light diffusing beads was deposited and subjected to irradiation using a xenon lamp with an exposure of 1000 mJ for 28 seconds, thereby forming a 150 µm thick UV coating layer for LED color conversion.

When operating a backlight unit including the prepared light guide plate and a blue LED, white light having high brightness was obtained.

Example 7

On a light exiting surface of a light guide plate as shown in FIG. 7, a mixture of 86 wt % of an epoxy acrylate monomer and an oligomer (containing 2.2 wt % of phenylglyoxylate as a photoinitiator), 5 wt % of $LiAlO_2$:Mn as a red phosphor, 4 wt % of $Y_3(Ga_xAl_{1-x})_5O_{12}$:Ce (0<x<1) as a green phosphor, 3 wt % of $BaMgAl_{10}O_{17}$ as a blue phosphor, and 2 wt % of polymethyl (meth)acrylate having an average particle diameter of 2.0 µm as light diffusing beads was deposited and subjected to irradiation using a xenon lamp with an exposure of 1000 mJ for 25 seconds, thereby forming a 100 µm thick UV coating layer for LED color conversion.

When operating a backlight unit including the prepared light guide plate and a UV LED, white light having high brightness was obtained.

Example 8

On a light exiting surface of a light guide plate as shown in FIG. 7, a mixture of 79 wt % of a urethane acrylate monomer and an oligomer (containing 3.5 wt % of alpha-hydroxyketone as a photoinitiator), 8 wt % of $LiAlO_2$:Mn as a red phosphor, 7 wt % of $Y_3(Ga_xAl_{1-x})_5O_{12}$:Ce (0<x<1) as a green phosphor, and 6 wt % of $BaMgAl_{10}O_{17}$ as a blue phosphor was deposited and subjected to irradiation using a xenon lamp with an exposure of 1000 mJ for 25 seconds, thereby forming a 120 µm thick UV coating layer for LED color conversion.

When operating a backlight unit including the prepared light guide plate and a violet LED, white light having high brightness was obtained.

Example 9

An LED lens was formed using an epoxy resin through injection molding, and a mixture of 42 wt % of an epoxy acrylate monomer and an oligomer (containing 5.5 wt % of alpha-hydroxyketone as a photoinitiator), 46 wt % of $(YGd)_3Al_5O_{12}$:Ce as a yellow phosphor, and 12 wt % of polymethyl (meth)acrylate having an average particle diameter of 2.0 µm (index of refraction: 1.50, light transmittance: 91%) as light diffusing beads was deposited on an upper surface of the LED lens and subjected to irradiation using a xenon lamp with an exposure of 890 mJ for 30 seconds, thereby forming a 63 µm thick UV coating layer for LED color conversion.

The prepared LED lens was mounted on a blue LED. Upon operation of the LED, white light was obtained.

Example 10

A 38 µm thick UV coating layer for LED color conversion was formed on a flat lower surface of an epoxy LED lens having a convex lens-shaped upper surface by the same method as in Example 9, except that a mixture of 45 wt % of an urethane acrylate monomer and an oligomer (containing 6.8 wt % of phenylglyoxylate as a photoinitiator), 27 wt % of $Y_2O_2S$:Eu,Gd as a red phosphor, 23 wt % of ZnS:Cu,Al as a green phosphor, and 5 wt % of polymethyl (meth)acrylate having an average particle diameter of 2.0 µm as light diffusing beads was deposited on the flat lower surface of the LED lens.

The prepared LED lens was mounted on a blue LED. Upon operation of the LED, white light was obtained.

Example 11

A 56 µm thick UV coating layer for LED color conversion was formed on a flat upper surface of an epoxy LED lens by the same method as in Example 9, except that a mixture of 40.0 wt % of an acryl acrylate monomer and an oligomer (containing 7.5 wt % of phenylglyoxylate as a photoinitiator), 20 wt % of $LiAlO_2$:Mn as a red phosphor, 15 wt % of $Y_3(Ga_xAl_{1-x})_5O_{12}$:Ce (0<x<1) as a green phosphor, 15 wt % of $BaMgAl_{10}O_{17}$ as a blue phosphor, and 10 wt % of polymethyl (meth)acrylate having an average particle diameter of 2.0 µm as light diffusing beads was deposited on the flat upper surface of the LED lens.

The prepared LED lens was mounted on a violet LED. Upon operation of the LED, white light was obtained.

Example 12

On a light entering surface of a light guide plate as shown in FIG. 5, a mixture of 60 wt % of a polyester acrylate monomer and an oligomer (containing 6.5 wt % of alpha-hydroxyketone as a photoinitiator), 35 wt % of $Sr_2Ga_2S_5$:$Eu^{2+}$ as a yellow phosphor, and 5 wt % of polymethyl (meth)acrylate having an average particle diameter of 2.0 µm as light diffusing beads was deposited and subjected to irradiation using a xenon lamp with an exposure of 1000 mJ for 20 seconds, thereby forming a 72 µm thick UV coating layer for LED color conversion.

When operating a backlight unit including the prepared light guide plate and a blue LED, white light was obtained.

Example 13

On a light exiting surface of a light guide plate as shown in FIG. 6, a mixture of 55 wt % of an epoxy acrylate monomer and an oligomer (containing 3.5 wt % of alpha-hydroxyketone as a photoinitiator), 25 wt % of $Li_2TiO_3$:Mn as a red phosphor, 15 wt % of $Ca_2MgSi_2O_2$:Cl as a green phosphor, and 5 wt % of polycarbonate having an average particle diameter of 3.0 μm (index of refraction: 1.59) as light diffusing beads was deposited and subjected to irradiation using a xenon lamp with an exposure of 1000 mJ for 28 seconds, thereby forming a 150 μm thick UV coating layer for LED color conversion.

When operating a backlight unit including the prepared light guide plate and a blue LED, white light having high brightness was obtained.

Example 14

On a light entering surface of a light guide plate as shown in FIG. 7, a mixture of 50 wt % of an epoxy acrylate monomer and an oligomer (containing 7.2 wt % of phenylglyoxylate as a photoinitiator), 25 wt % of $LiAlO_2$:Mn as a red phosphor, 12 wt % of $Y_3(Ga_xAl_{1-x})_5O_{12}$:Ce (0<x<1) as a green phosphor, 10 wt % of $BaMgAl_{10}O_{17}$ as a blue phosphor, and 3 wt % of polymethyl (meth)acrylate having an average particle diameter of 2.0 μm as light diffusing beads was deposited and subjected to irradiation using a xenon lamp with an exposure of 1000 mJ for 25 seconds, thereby forming a 48 μm thick UV coating layer for LED color conversion.

When operating a backlight unit including the prepared light guide plate and a UV LED, white light having high brightness was obtained.

INDUSTRIAL APPLICABILITY

The present invention provides a UV coating composition for LED color conversion, which includes a phosphor for color conversion and, optionally, a light diffusing bead and/or a pigment, in a heat-resistant transparent UV-curable matrix resin to allow white light for lighting or a display device to be obtained through a simple and inexpensive structure from a high brightness blue LED, violet LED or UV LED having a long lifespan without an expensive white LED having a relatively short lifespan and high brightness, which has a flat coating surface such that the phosphor for color conversion can be uniformly distributed and coated thereon, which can provide smoother and more comfortable illumination by effectively relieving glare due to high brightness of the LED when applied to lighting, and which permits compactness and structural simplification when applied to a display device. Therefore, the present invention has industrial applicability.

The invention claimed is:

1. A UV coating composition for LED color conversion comprising: 25-96.99 wt % of a UV-curable resin; 3-65 wt % of a phosphor for color conversion; and 0.01-10.0 wt % of light diffusing beads having an average particle diameter of 0.2-30 μm; said light diffusing beads comprising a mixture of three types of light diffusing beads having average particle diameters of 1-4 μm, 5-10 μm and 11-30 μm, which are mixed in a weight ratio of 1:0.4-0.8:0.1-0.3.

2. The UV coating composition according to claim 1, further comprising: 0.1-3.0 wt % of a pigment.

3. The UV coating composition according to claim 1, wherein the UV-curable resin is at least one selected from the group consisting of urethane acrylate, epoxy acrylate, polyester acrylate, and acryl acrylate resins.

4. The UV coating composition according to claim 1, wherein the phosphor for color conversion comprises a yellow phosphor selected from YAG-based $(YGd)_3Al_5O_{12}$: Ce and $Sr_2Ga_2S_5$:$Eu^{2+}$ to convert blue light emitted from a blue LED into white light.

5. The UV coating composition according to claim 1, wherein the phosphor for color conversion comprises a red phosphor and a green phosphor to convert blue light emitted from a blue LED into white light, the red phosphor being selected from $Y_2O_2S$:Eu,Gd, $Li_2TiO_3$:Mn, $LiAlO_2$:Mn, $6MgO.As_2O_5$:$Mn^{4+}$ and $3.5MgO.0.5MgF_2.GeO_2$:$Mn^{4+}$, the green phosphor being selected from ZnS:Cu,Al, $Ca_2MgSi_2O_7$:Cl, $Y_3(Ga_xAl_{1-x})_5O_{12}$:Ce (0<x<1), $La_2O_3.11Al_2O_3$:Mn and $Ca_8Mg(SiO_4)_4Cl_2$:Eu,Mn.

6. The UV coating composition according to claim 5, wherein the red phosphor and the green phosphor are mixed in a weight ratio of 1:0.2-1.2.

7. The UV coating composition according to claim 1, wherein the phosphor for color conversion comprises a red phosphor, a green phosphor and a blue phosphor to convert light emitted from a violet LED or a UV LED into white light, the red phosphor being selected from $Y_2O_2S$:Eu,Gd, $Li_2TiO_3$: Mn, $LiAlO_2$:Mn, $6MgO.As_2O_5$:$Mn^{4+}$ and $3.5MgO.0.5MgF_2.GeO_2$:$Mn^{4+}$, the green phosphor being selected from ZnS:Cu,Al, $Ca_2MgSi_2O_7$:Cl, $Y_3(Ga_xAl_{1-x})_5O_{12}$:Ce (0<x<1), $La_2O_3.11Al_2O_3$: Mn and $Ca_8Mg(SiO_4)_4Cl_2$:Eu,Mn, the blue phosphor being selected from $BaMgAl_{10}O_{17}$ and $(Sr,Ca,BaMg)_{10}(PO_4)_6Cl_2$:Eu.

8. The UV coating composition according to claim 7, wherein the red phosphor, the blue phosphor, and the green phosphor are mixed in a weight ratio of 1:0.2-1.2:0.2-1.2.

* * * * *